(12) United States Patent
Pargas et al.

(10) Patent No.: US 9,356,226 B2
(45) Date of Patent: May 31, 2016

(54) SELF-POWERED IRRIGATION APPARATUS

(71) Applicant: Signature Control Systems, Inc., Irvine, CA (US)

(72) Inventors: John Pargas, Aliso Viejo, CA (US); Brian J. Smith, Irvine, CA (US)

(73) Assignee: Signature Control Systems, Inc., Irvine, CA (US)

( * ) Notice: Subject to any disclaimer, the term of this patent is extended or adjusted under 35 U.S.C. 154(b) by 346 days.

(21) Appl. No.: 14/048,251

(22) Filed: Oct. 8, 2013

(65) Prior Publication Data

US 2015/0097515 A1    Apr. 9, 2015

(51) Int. Cl.
| | |
|---|---|
| *H01L 41/113* | (2006.01) |
| *H02J 7/00* | (2006.01) |
| *H02N 2/18* | (2006.01) |

(52) U.S. Cl.
CPC .............. *H01L 41/113* (2013.01); *H02J 7/0052* (2013.01); *H02N 2/18* (2013.01)

(58) Field of Classification Search
CPC .............. H01L 41/113; H01L 41/1132; H01L 41/1134; H01L 41/1136; H01L 41/1138
USPC .......................................................... 310/339
See application file for complete search history.

(56) References Cited

U.S. PATENT DOCUMENTS

| | | | | |
|---|---|---|---|---|
| 2008/0277941 | A1* | 11/2008 | Bowles | ............... H02N 2/185 310/339 |
| 2009/0260438 | A1* | 10/2009 | Hedtke | ............... G01H 11/08 73/579 |
| 2009/0267452 | A1* | 10/2009 | Abdallah | ............... H02N 2/18 310/319 |

* cited by examiner

*Primary Examiner* — Derek Rosenau
(74) *Attorney, Agent, or Firm* — Sheppard, Mullin, Richter & Hampton LLP

(57) ABSTRACT

An irrigation apparatus is provided, comprising: a pressure vessel configured to hold water under pressure, and configured to expand and contract based on the pressure of the held water; a selectable throttle configured to receive water at a first pressure, configured to provide the water to the pressure vessel at the first pressure when the selectable throttle is at a first setting, and configured to provide the water to the pressure vessel at a second pressure that is smaller than the first pressure when the selectable throttle is at a second setting; a control circuit configured to control whether the selectable throttle is at the first setting or at the second setting; and a piezoelectric element attached to the pressure vessel and configured to generate electricity when the pressure vessel expands or contracts.

16 Claims, 5 Drawing Sheets

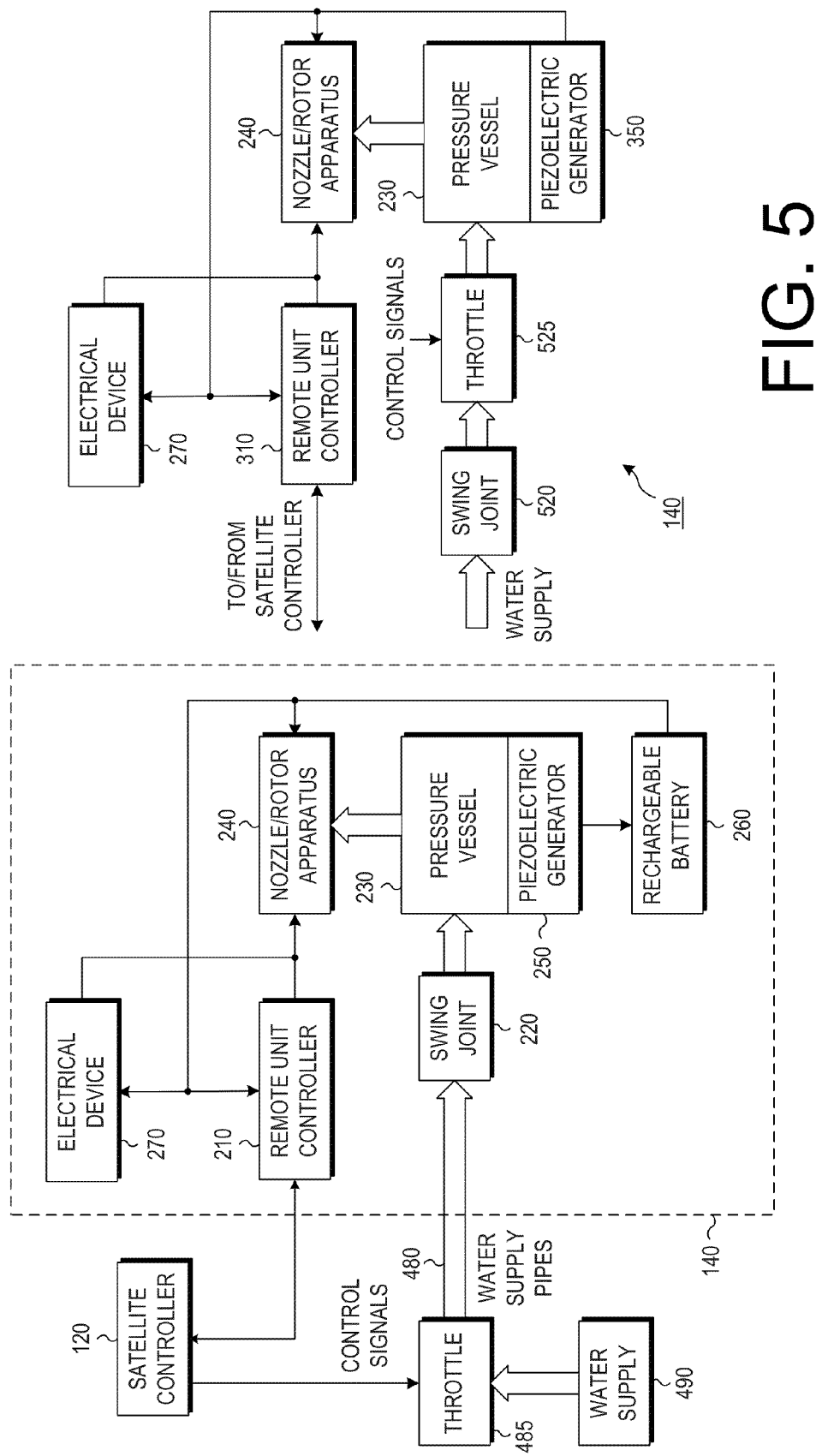

SELF-POWERED IRRIGATION APPARATUS

FIELD OF THE INVENTION

The present disclosure is related in general to irrigation units configured to provide water to a specific plot of land. More specifically, the present disclosure is related to irrigation units that include a piezoelectric element that uses the deformation of one or more elements in the irrigation unit to generate electricity to power the irrigation unit.

BACKGROUND OF THE INVENTION

Irrigation units are used in a variety of situations, including personal yards, commercial properties, golf courses, farms, etc. Anywhere in which a plot of land needs to be irrigated can benefit from the use of an irrigation unit.

A typical irrigation unit will only irrigate a limited area, e.g., several hundred square feet. As a result, areas to be irrigated that are larger than this will require multiple irrigation units, the operation of which should be coordinated. Furthermore, in addition to control signals, each of these units must be provided with both water and power. Thus, when a large area must be irrigated, water pipes and power lines must be run to a large number of individual irrigation units. This can be an expensive undertaking.

Generally, it is unavoidable to have to run water lines to the irrigation units, since the entire purpose of having irrigation units is to distribute water. However, it is possible for power to be locally generated at the irrigation units. Having sufficient power generated at each individual irrigation unit could potentially eliminate the need for running power lines to be irrigation units, thus both simplifying the irrigation system, and making it cheaper to install and maintain.

Therefore, it would be desirable to provide an irrigation system in which individual irrigation units generated sufficient power at their locations for the running of each irrigation unit.

SUMMARY OF THE INVENTION

An irrigation apparatus is provided, comprising: a pressure vessel configured to hold water under pressure, and configured to expand and contract based on the pressure of the held water; a selectable throttle configured to receive water at a first pressure, configured to provide the water to the pressure vessel at the first pressure when the selectable throttle is at a first setting, and configured to provide the water to the pressure vessel at a second pressure that is smaller than the first pressure when the selectable throttle is at a second setting; a control circuit configured to control whether the selectable throttle is at the first setting or at the second setting; and a piezoelectric element attached to the pressure vessel and configured to generate electricity when the pressure vessel expands or contracts.

The pressure vessel may be one of a sprinkler body, a rotor body, or a supply pipe.

The irrigation apparatus may further comprise: a rechargeable battery, wherein the piezoelectric element is further configured to recharge the battery.

The piezoelectric element may be further configured to provide power to the control circuit.

The irrigation apparatus may further comprise: a radio transceiver, wherein the piezoelectric element is further configured to provide power to the radio transceiver.

The irrigation apparatus may further comprise: a solenoid, wherein the piezoelectric element is further configured to provide power to the solenoid.

The irrigation apparatus may further comprise: a swing joint located between the selectable throttle and the pressure vessel and configured to carry water from the selectable throttle to the pressure vessel.

The irrigation apparatus may further comprise: a swing joint located between the selectable throttle and a water supply pipe, wherein the swing joint is configured to carry water from the water supply pipe to the selectable throttle, and the selectable throttle is configured to carry water from the swing joint to the pressure vessel.

The piezoelectric element may comprise a piezoelectric strip. The piezoelectric strip may be attached to the pressure vessel.

A method for operating an irrigation apparatus is provided, comprising: supplying water to a pressure vessel with a first water pressure as a supply water pressure; engaging a throttle on the supplied water to reduce the supply water pressure to a second water pressure that is less than the first water pressure; providing water to the pressure vessel at the second water pressure; generating electricity from a deflection of the pressure vessel using a piezoelectric element; disengaging the throttle on the supplied water to increase the supply water pressure to the first water pressure; providing water to the pressure vessel at the first water pressure; and generating electricity from an expansion of the pressure vessel using the piezoelectric element, wherein the first water pressure and the second water pressure are sufficiently different that the pressure vessel will expand to a first size when provided water at the first water pressure, and the pressure vessel will contract to a second size that is smaller than the first size when provided water at the second water pressure.

The pressure vessel may be one of a sprinkler body, a rotor body, or a supply pipe.

The operations of engaging a throttle, providing water to the pressure vessel at the second water pressure, generating electricity from a retraction of the pressure vessel, disengaging the throttle, providing water to the pressure vessel at the first water pressure, and generating electricity from an expansion of the pressure vessel may be repeated multiple times.

The method may further comprise: recharging a battery with the electricity generated from the contraction of the pressure vessel; and recharging the battery with the electricity generated from the expansion of the pressure vessel.

An irrigation apparatus is provided, comprising: a means for containing water; a means for supplying water to the means for containing water with a first water pressure as a supply water pressure; a means for increasing a throttling of the supplied water to reduce the supply water pressure to a second water pressure that is less than the first water pressure; a means for decreasing the throttling of the supplied water to increase the supply water pressure to the first water pressure; a means for providing water to the means for containing water; a means for generating electricity from an expansion or a contraction of the means for containing water using a piezoelectric element, wherein the first water pressure and the second water pressure are sufficiently different that the means for containing water will expand to a first size when provided water at the first water pressure, and the means for containing water will contract to a second size that is smaller than the first size when provided water at the second water pressure.

The means for generating electricity may comprise a piezoelectric strip. The piezoelectric strip may be attached to the means for containing water. The means for generating electricity from a retraction of the means for containing water using a piezoelectric element, and the means for generating electricity from an expansion of the means for containing water using the piezoelectric element may comprise a piezoelectric strip.

The irrigation apparatus may further comprise: a means for storing energy, wherein the piezoelectric element is further configured to recharge the means for storing energy.

The piezoelectric element may be further configured provide power to the means for increasing the throttling of the supplied water and the means for decreasing the throttling of the supplied water.

BRIEF DESCRIPTION OF THE DRAWINGS

The accompanying figures, where like reference numerals refer to identical or functionally similar elements and which together with the detailed description below are incorporated in and form part of the specification, serve to further illustrate an exemplary embodiment and to explain various principles and advantages in accordance with the present invention.

FIG. 4 is a block diagram of an irrigation unit and associated elements according to yet other disclosed embodiments;

FIG. 5 is a block diagram of an irrigation unit according to still other disclosed embodiments;

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Figure 1:
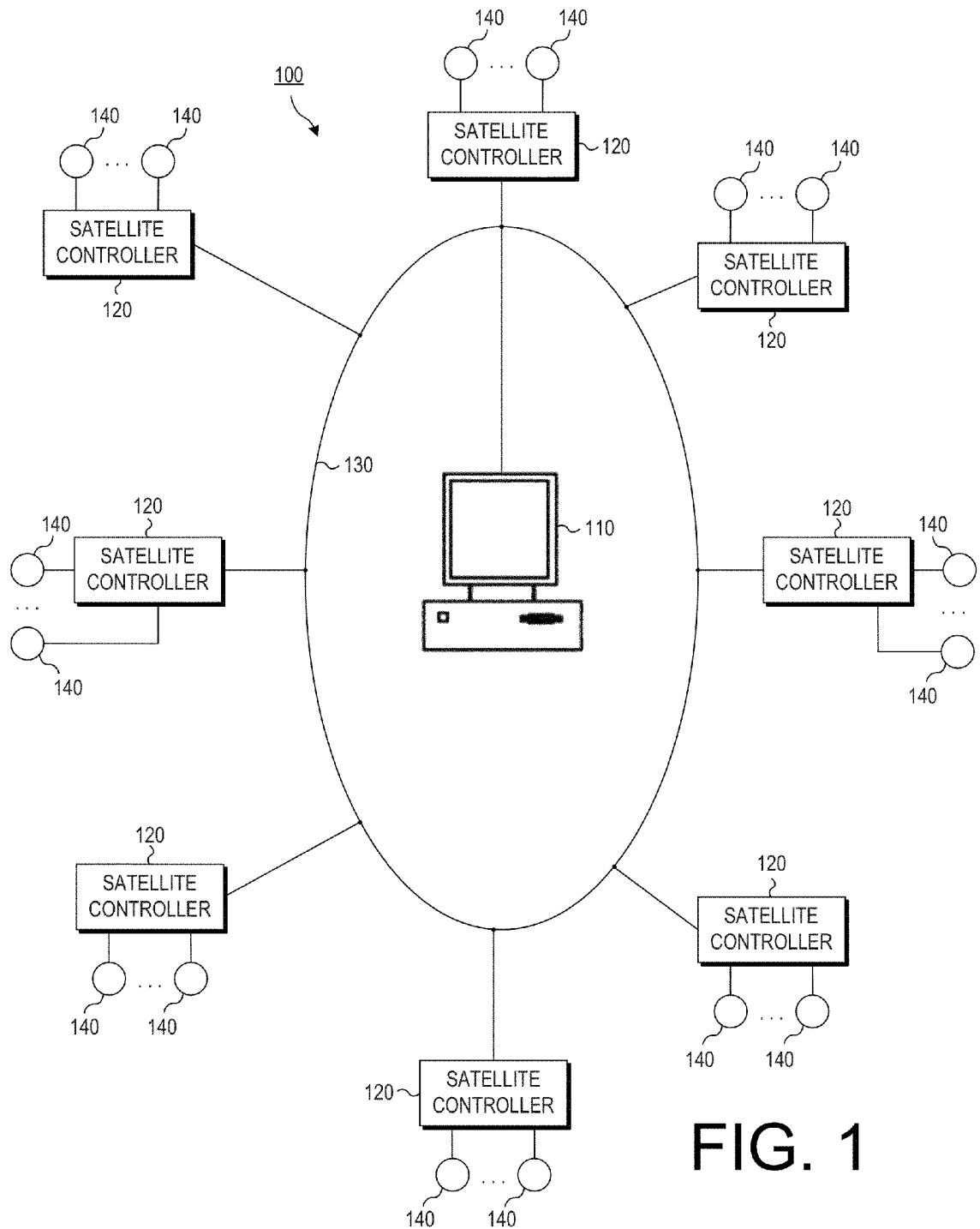
FIG. 1 is a block diagram of an irrigation system according to disclosed embodiments.

FIG. 1 is a block diagram of an irrigation system 100 according to disclosed embodiments. As shown in FIG. 1, the irrigation system 100 includes a central controller 110, and a plurality of satellite controllers 120 connected to the central controller 110 by a control bus 130. The central controller 110 controls the operation of the satellite controller 120. Each satellite controller 120, in turn, controls the operation of a plurality of irrigation units 140.

The central controller 110 operates to control the entire irrigation system 100 from a centralized location. In various embodiments, the central controller 110 can be a centralized computer connected to the plurality of satellite controllers 120 by the control bus 130.

The plurality of satellite controllers 120 are distributed throughout the irrigation system 100 at disparate locations in order to control the various irrigation units 140. Typically, a single satellite controller 120 will control the operation of a plurality of localized irrigation units 140. In various embodiments the satellite controllers 120 can be microprocessors programmed to control the operation of the irrigation units 140. Each of the satellite controllers 120 is connected to the central controller 110 by the control bus 130.

The control bus 130 carries signals between the central controller 110 and the plurality of satellite controllers 120. In various embodiments it can be a wired bus or a wireless bus. If the control bus 130 is a wired bus, physical wires connect the central controller 110 and the plurality of satellite controllers 120. If the control bus 130 is a wireless bus, there is no physical connection between the central controller 110 and the plurality of satellite controllers 120. However, in such a case, each of the central controller 110 and the plurality of satellite controllers 120 must contain a transceiver of some sort to pass signals wirelessly.

The plurality of irrigation units 140 operate to irrigate adjacent plot of land using water obtained from a water source (not shown). In various embodiments these irrigation units can include sprinklers, water jets, or any other suitable water delivery system.

System Using a Piezoelectric Generator and a Rechargeable Battery

Figure 2:
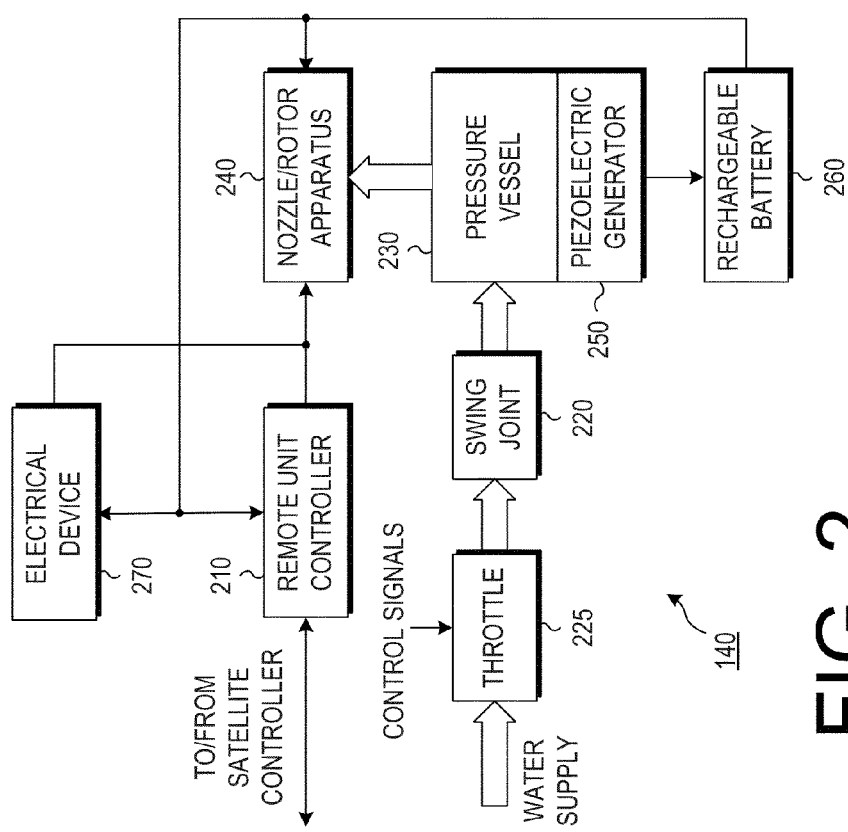
FIG. 2 is a block diagram of an irrigation unit according to disclosed embodiments.

FIG. 2 is a block diagram of an irrigation unit 140 according to disclosed embodiments. In particular, the embodiments of FIG. 2 show an irrigation unit 140 that employs a piezoelectric generator 250 and a rechargeable battery 260 in order to provide power to the irrigation unit 140.

As shown in FIG. 2, the irrigation unit 140 includes a remote unit controller 210, a swing joint 220, a throttle 225, a pressure vessel 230, a nozzle/rotor apparatus 240, a piezoelectric generator 250, a rechargeable battery 260, and an electrical device 270.

The remote unit controller 210 controls the operation of the irrigation unit 140 based on control signals received from the satellite controller 120, which, in turn, is controlled by the central controller 110. These signals can be sent over wires, or wirelessly, in various embodiments.

The swing joint 220 connects the water supply to the pressure vessel 230, and serves as a conduit for water provided by the water supply to the pressure vessel 230. In this embodiment, the water supply can be a water supply pipe, e.g., a PVC pipe, that carries the water from a central source. In various embodiments, the water supply can be above-ground or underground. A swing joint 220 is used in this embodiment to connect the water supply to the pressure vessel 230 in order to provide flexibility for the positioning of the pressure vessel 230 with respect to the water supply.

The throttle 225 is placed in between the water supply and the swing joint 220. It is used to regulate the flow of water from the water supply to the pressure vessel 230, via the swing joint 220. The throttle 225 is controlled by control signals from either the satellite controller 120 associated with the irrigation unit 140, or the remote unit controller 210 that controls the operation of the irrigation unit 140.

In operation, the throttle 225 is configured to provide the water to the pressure vessel 230 at two or more different water pressures in a repeating pattern. For example, the throttle 225 may be configured to provide water to the pressure vessel 230 at a first (high) pressure for a first duration, and then to provide water to the pressure vessel 230 at a second (low) pressure for a second duration. In the alternative, a succession of multiple changing water pressures can also be used.

The pressure vessel 230 serves as a reservoir for water received from the water supply, and sprayed by the nozzle/rotor apparatus 240 onto an adjacent plot of land. When the water provided to the pressure vessel 230 is varied in pressure over time, the pressure vessel 230 will expand and contract, expanding when water of a relatively higher pressure is provided to it, and contracting when water of a relatively lower pressure is provided to it. In one particular embodiment in which the water pressure is varied between 25 PSI and 150 PSI, The pressure vessel 230 can deform on the order of approximately 600 microstrain (i.e., 600 ppm deformation with respect to the size of the pressure vessel 230).

The nozzle/rotor apparatus 240 operates to spray water received from the pressure vessel 230 onto an adjacent plot of land. In various embodiments, the nozzle/rotor apparatus 240 can spray in a single direction, or can be configured to rotate such that it sprays in multiple directions over time.

The piezoelectric generator 250 is attached to the pressure vessel 230 in such a way that microstrain deformation of the pressure vessel 230 will cause the piezoelectric generator 250 to generate a voltage. In one set of embodiments, a piezoelectric generator 250 that is properly attached to the pressure vessel 230 can generate approximately 5-15 µV per microstrain. In an embodiment in which the pressure vessel 230 expands and contracts by approximately 600 microstrain, this means that the piezoelectric generator 250 can generate a voltage of approximately 3-9 mV.

In one embodiment, the piezoelectric generator 250 can be a piezoelectric gauge wrapped around the pressure vessel 230. In alternate embodiments, other types of piezoelectric generator can be used.

The rechargeable battery 260 is connected to and charged by the piezoelectric generator 250. It provides power to the nozzle/rotor apparatus 240, the remote unit controller 210, and the electrical device 270.

The electrical device 270 can be any type of electrical device associated with the irrigation unit 140. For example, the electrical device 270 can be a radio transceiver used to send and receive control signals from a satellite controller 120. Alternatively, the electrical device 270 could be a solenoid that detects magnetic signals used to control the irrigation unit 140. Other types of electrical device 270 are also possible.

In this way, an irrigation unit 140 that is relatively self-sufficient can be provided. The rechargeable battery 260 can be used to power all of the parts of the irrigation unit 140 that require power. As a result, this can eliminate the need for power lines to be run to each of the irrigation units 140, thereby simplifying the entire irrigation system 100, while making it cheaper to install and maintain.

System Using a Piezoelectric Generator Alone

Figure 3:
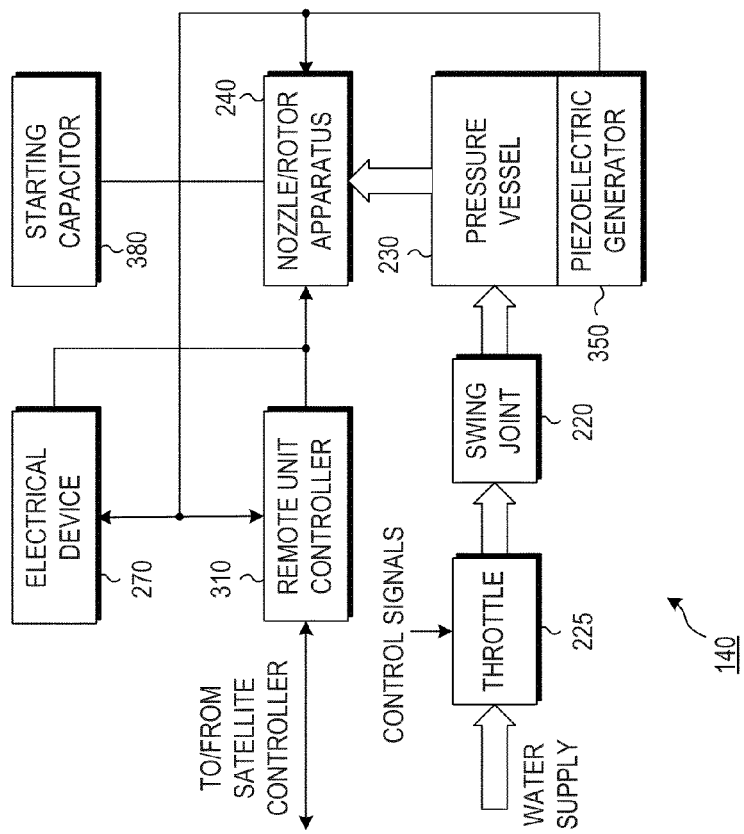
FIG. 3 is a block diagram of an irrigation unit according to other disclosed embodiments.

FIG. 3 is a block diagram of an irrigation unit 140 according to other disclosed embodiments. In particular, the embodiments of FIG. 2 show an irrigation unit 140 that employs only a piezoelectric generator 250 in order to provide power to the irrigation unit 140.

As shown in FIG. 3, the irrigation unit 140 includes a remote unit controller 310, a swing joint 220, a throttle 225, a pressure vessel 230, a nozzle/rotor apparatus 240, a piezoelectric generator 350, an electrical device 270, and a nozzle/rotor starting circuit 380.

The swing joint 220, the throttle 225, the pressure vessel 230, the nozzle/rotor apparatus 240, and the electrical device 270 all operate as described above with respect to FIG. 2.

The remote unit controller 310 controls the operation of the irrigation unit 140 based on control signals received from the satellite controller 120, which, in turn, is controlled by the central controller 110. These signals can be sent over wires, or wirelessly, in various embodiments.

The nozzle/rotor starting circuit 380 operates to provide startup power to the nozzle rotor apparatus when the irrigation unit 140 is initially turned on. It need only store enough power to start the nozzle/rotor apparatus until the piezoelectric generator 350 provides sufficient power for the operation of the nozzle/rotor apparatus 240. The piece electric generator 350 can then replace the charge used from the nozzle/rotor starting circuit 380, in preparation for the next time the irrigation unit 140 is turned on. The irrigation unit 140 may be installed with the nozzle/rotor starting circuit 380 fully charged. In various embodiments, the nozzle/rotor starting circuit 380 can be a capacitor (e.g., a super capacitor circuit), a battery, or any suitable element for temporarily providing power to the nozzle/rotor apparatus 240.

As in the embodiments of FIG. 2, the piezoelectric generator 350 in the embodiments of FIG. 3 is attached to the pressure vessel 230 in such a way that microstrain deformation of the pressure vessel 230 will cause the piezoelectric generator 250 to generate a voltage. As noted above, in one set of embodiments, a piezoelectric generator 250 that is properly attached to the pressure vessel 230 can generate approximately 5-15 microvolts per microstrain, which can translate into 3-9 mV when the pressure vessel 230 expands and contracts by approximately 600 microstrain.

Unlike the embodiments of FIG. 2, the irrigation unit 140 of the embodiments of FIG. 3 does not use a rechargeable battery as an intermediary between the piece electric generator 250 and the devices that require power (the remote unit controller 210, the nozzle/rotor apparatus 240, and the electrical device 270), but connects the piezoelectric generator 350 directly to the nozzle/rotor apparatus 240, the remote unit controller 210, and the electrical device 270. Thus, the voltage provided by the piezoelectric generator 350 will directly power the remote unit controller 210, the nozzle/rotor apparatus 240, and the electrical device 270.

As noted above, the nozzle/rotor charging circuit 380 will provide the initial power required to get the nozzle/rotor apparatus 240 operating, after which time it is recharged and the nozzle/rotor apparatus 240 continues operation using power from the piezoelectric generator 350.

System Using a Throttle Separate from the Irrigation Unit

FIG. 4 is a block diagram of an irrigation unit 140 and associated elements according to yet other disclosed embodiments. In particular, FIG. 4 shows the use of a throttle that is separate from the irrigation unit, e.g., connected to a water supply 490 associated with the irrigation unit 140.

As shown in as shown in FIG. 4, an irrigation unit 140 is connected to a satellite controller 120 and to a throttle 485 through water supply pipes 480. The throttle, in turn, is connected to a water supply 490. The irrigation unit 140 includes a remote unit controller 210, a swing joint 220, a pressure vessel 230, a piezoelectric generator 250, a rechargeable battery 260, and an electrical device 270.

The remote unit controller 210, swing joint 220, the pressure vessel 230, the nozzle/rotor apparatus 240, the piezoelectric generator 250, the rechargeable battery 260, and the electrical device 270 all operate as described above with respect to FIG. 2. Likewise, the satellite controller 120 operates as described above with respect to FIG. 1.

The water supply pipes 480 receive water from the throttle 485, and provide water to the swing joint 220.

The throttle 485 receives water from the water supply 490, and supplies it to the water supply pipes 480. The throttle 485 operates in response to control signals from the satellite controller 12o to regulate the flow of water from the water supply 490 to the water supply pipes 480. In particular, the throttle operates to regulate the pressure of the water supplied to the water supply pipes 480 between two or more different water pressures.

The water supply 490 can be a water supply pipe, e.g., a PVC pipe that carries the water from a central source. In various embodiments, the water supply 490 can be aboveground or underground.

Unlike the embodiment of FIG. 2, the embodiment of FIG. 4 places the throttle 485 outside of the irrigation unit 140, and separated from the irrigation unit 140 by the water supply pipes 480. However, the throttle 485 operates in a manner similar to the throttle 225 from the embodiment of FIG. 2.

In particular, the throttle 485 is configured to provide the water to the water supply pipes 480 at two or more different water pressures in a repeating pattern. For example, the throttle 485 may be configured to provide water to the water supply pipes 480 at a first (high) pressure for a first duration, and then to provide water to the water supply pipes 480 at a second (low) pressure for a second duration. In alternate embodiments, a succession of multiple, different water pressures can also be used.

System Using a Throttle Between a Swing Joint and a Pressure Vessel

FIG. 5 is a block diagram of an irrigation unit 140 according to still other disclosed embodiments. In particular, the embodiments of FIG. 5 shown irrigation unit in which a throttle 520 is located between a swing joint 525 and a pressure vessel 230.

As shown in FIG. 5, the irrigation unit 140 includes a remote unit controller 310, a swing joint 520, a throttle 525, a pressure vessel 230, a nozzle/rotor apparatus 240, a piezoelectric generator 250, and an electrical device 270.

The remote unit controller 310, the pressure vessel 230, the nozzle/rotor apparatus 240, the piezoelectric generator 350, and the electrical device 270 all operate as described above with respect to FIGS. 2 and 3.

The swing joint 520 operates as the swing joint 220 described above with respect to FIG. 2. Likewise, the throttle 525 operates as the throttle 225 described above with respect to FIG. 2. However, in the embodiment of FIG. 5, the throttle 525 is located between the swing joint 520 and the pressure vessel 230, rather than the swing joint 220 being located between the throttle 225 and the pressure vessel 230.

Nevertheless, the throttle 525 is still configured to provide the water to the pressure vessel 230 at two or more different water pressures in a repeating pattern. For example, the throttle 525 may be configured to provide water to the pressure vessel 230 at a first (high) pressure for a first duration, and then to provide water to the pressure vessel 230 at a second (low) pressure for a second duration. As in the previous embodiments, a succession of multiple, different water pressures can also be used.

Exemplary Pressure Vessel and Piezoelectric Generator

Figure 6:
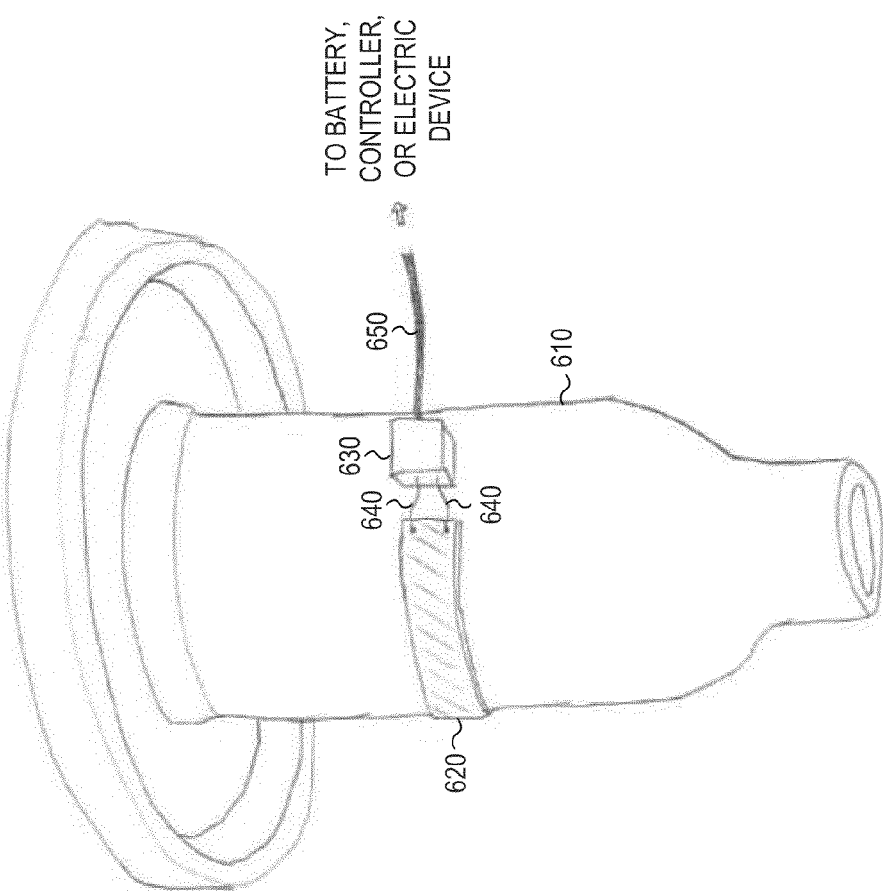
FIG. 6 is a perspective view of a portion of an irrigation unit according to disclosed embodiments.

FIG. 6 is a perspective view of a portion of an irrigation unit 140 according to disclosed embodiments. As shown in FIG. 6, the portion of the irrigation unit 140 includes a pressure vessel 610, a piezoelectric gage 620, a resistor 630, connection element 640, and a power supply line 650.

The pressure vessel 610 is an element of the irrigation unit 140 that receives a quantity of water from a water supply, and provides the water to a nozzle, sprinkler, or other water distribution element, where the water is provided to irrigate an adjacent plot of land.

The piezoelectric gage 620 is wrapped around the pressure vessel 610, where it will be moved by the expansion and the contraction of the pressure vessel 610. As the piezoelectric gage 620 is moved, it will generate electricity.

The resistor 630 is connected to the piezoelectric gage 620 by the connection element 640 and serves to generate a current that can be provided into the power supply line 650. The connection elements 640 in this embodiment can be solder tabs or any appropriate connection element.

Using this design, power can be generated that can be provided directly to elements in the irrigation unit 140, or can be provided to a rechargeable battery for future use by irrigation unit 140.

Method of Operating an Irrigation Unit

Figure 7:
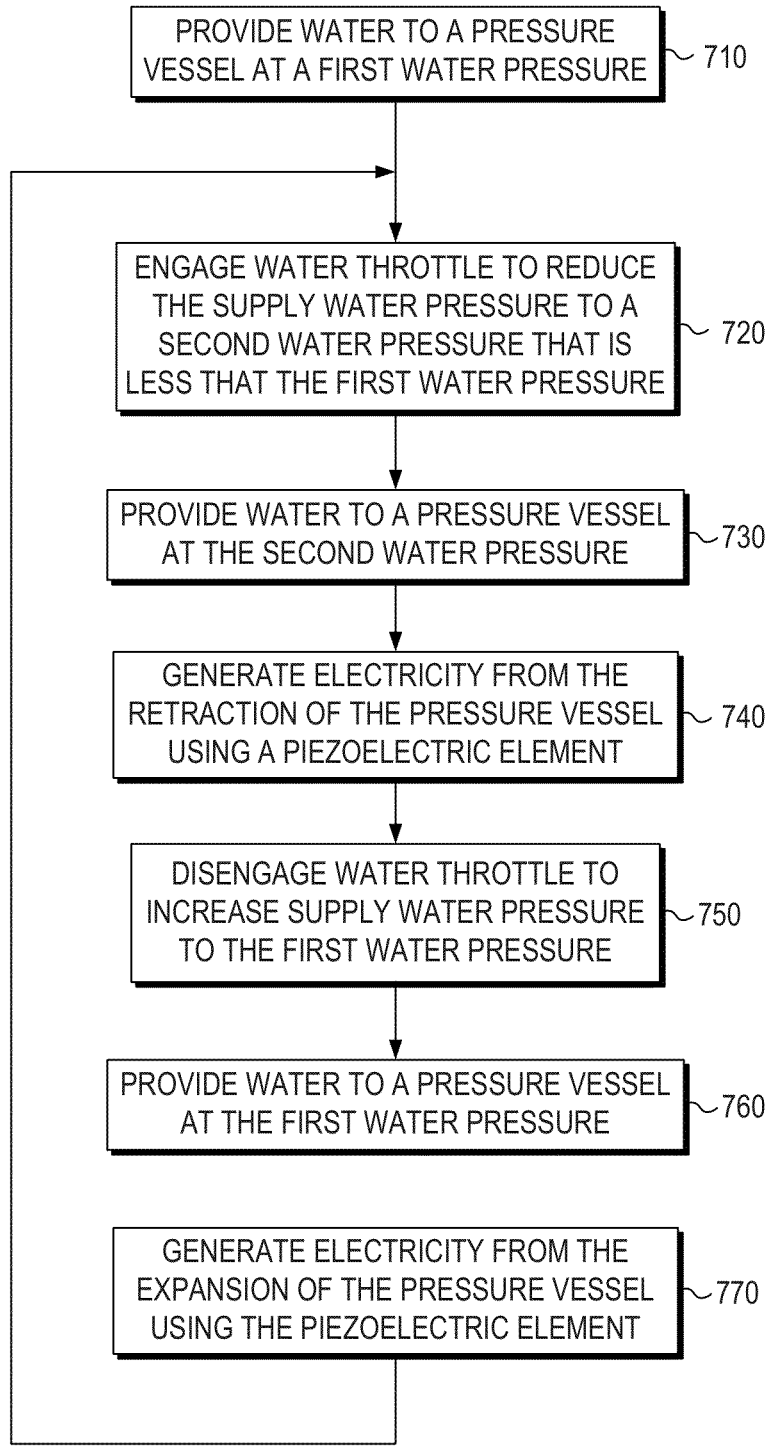
FIG. 7 is a flow chart showing the operation of an irrigation unit according to disclosed embodiments.

FIG. 7 is a flow chart showing the operation of an irrigation unit according to disclosed embodiments. As shown in FIG. 7, operation begins when water is provided to a pressure vessel 230 at a first water pressure (710).

A water throttle 225, 485, 525 is then engaged to reduce the supply water pressure to a second water pressure that is less than the first water pressure (720). Water is then provided to the pressure vessel 230 at the second water pressure (730).

Electricity is then generated from the retraction of the pressure vessel 230 using a piezoelectric element 250, 350 (740). The electricity generated at the piezoelectric element 250, 350 can be used directly by elements in the irrigation unit 140, or can be stored in a rechargeable battery 260 for future use by the irrigation unit 140.

The water throttle 225, 485, 525 is then disengaged to increase the supply water pressure to the first water pressure (750). Water is then provided to the pressure vessel 230 at the first water pressure (760).

Electricity is then generated from the expansion of the pressure vessel 230 using the piezoelectric element 250, 350 (770).

In the engaging and the disengaging of the water throttle 225, 485, 525 (i.e., operations 720-770) can then be repeated multiple times to continually generate electricity at the piezoelectric element 250, 350 based on the expansion and retraction of the pressure vessel 230.

Although this embodiment shoes the use of two different water pressures, alternate embodiments could use a multiple succession of water pressures to generate electricity. In such embodiments, the water throttle 225, 485, 525 could vary between three or more different water pressures, each of which would cause expansion or contraction of the pressure vessel 230, which in turn would cause the piezoelectric generator 250, 350 to generate electricity.

In addition, although in the various disclosed embodiments, the piezoelectric generator 250, 350 is shown as being attached to the pressure vessel, in alternate embodiments it can be attached to the swing joint, the throttle, or an associated hydraulic pipe. In particular, any deformable part of the water flow system that receives water of two different pressures can be used to operate a piezoelectric generator.

Alternate Placement of the Piezoelectric Generator

Although the above disclosed embodiments show the piezoelectric generator 250, 350 as being connected to the pressure vessel, in alternate embodiments the piezoelectric generator 250, 350 could be connected to the swing joint 220, to a pipe connecting any of the swing joint 220, throttle 225, or pressure vessel 230, or to any other suitable element in the irrigation unit 140. In particular, any element of the irrigation unit 140 downstream from the throttle 225 that will expand and contract as the water pressure changes can be used by a piezoelectric generator to generate power for the irrigation unit 140.

For example, in one alternate embodiment a piezoelectric generator can be attached to a swing joint located between the throttle and the pressure vessel. In another alternate embodiment, a piezoelectric generator can be attached to a pipe located between a swing joint and the pressure vessel. Numerous other suitable locations may also be selected, depending upon the configuration of the irrigation unit.

Conclusion

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. An irrigation apparatus, comprising:
   a pressure vessel configured to hold water under pressure, and configured to expand and contract based on the pressure of the held water;
   a selectable throttle configured to receive water at a first pressure, configured to provide the water to the pressure vessel at the first pressure when the selectable throttle is at a first setting, and configured to provide the water to the pressure vessel at a second pressure that is smaller than the first pressure when the selectable throttle is at a second setting;
   a control circuit configured to control whether the selectable throttle is at the first setting or at the second setting; and
   a piezoelectric element attached to the pressure vessel and configured to generate electricity when the pressure vessel expands or contracts.

2. The irrigation apparatus of claim 1, wherein
   the pressure vessel is one of a sprinkler body, a rotor body, or a supply pipe.

3. The irrigation apparatus of claim 1, further comprising:
   a rechargeable battery,
      wherein the piezoelectric element is further configured to recharge the battery.

4. The irrigation apparatus of claim 1, wherein the piezoelectric element is further configured to provide power to the control circuit.

5. The irrigation apparatus of claim 1, further comprising: a radio transceiver,
   wherein the piezoelectric element is further configured to provide power to the radio transceiver.

6. The irrigation apparatus of claim 1, further comprising: a solenoid,
   wherein the piezoelectric element is further configured to provide power to the solenoid.

7. The irrigation apparatus of claim 1, further comprising a swing joint located between the selectable throttle and the pressure vessel and configured to carry water from the selectable throttle to the pressure vessel.

8. The irrigation apparatus of claim 1, further comprising:
   a swing joint located between the selectable throttle and a water supply pipe, wherein the swing joint is configured to carry water from the water supply pipe to the selectable throttle, and
   the selectable throttle is configured to carry water from the swing joint to the pressure vessel.

9. The irrigation apparatus of claim 1, wherein the piezoelectric element comprises a piezoelectric strip.

10. The irrigation apparatus of claim 9, wherein the piezoelectric strip is attached to the pressure vessel.

11. An irrigation apparatus, comprising: a means for containing water;
    a means for supplying water to the means for containing water with a first water pressure as a supply water pressure;
    a means for increasing a throttling of the supplied water to reduce the supply water pressure to a second water pressure that is less than the first water pressure;
    a means for decreasing the throttling of the supplied water to increase the supply water pressure to the first water pressure;
    a means for providing water to the means for containing water;
    a means for generating electricity from an expansion or a contraction of the means for containing water using a piezoelectric element,
    wherein the first water pressure and the second water pressure are sufficiently different that the means for containing water will expand to a first size when provided water at the first water pressure, and the means for containing water will contract to a second size that is smaller than the first size when provided water at the second water pressure.

12. The irrigation apparatus of claim 11, wherein
    the means for generating electricity comprises a piezoelectric strip.

13. The irrigation apparatus of claim 12, wherein the piezoelectric strip is attached to the means for containing water.

14. The irrigation apparatus of claim 11, wherein
    the means for generating electricity from a retraction of the means for containing water using a piezoelectric element, and the means for generating electricity from an expansion of the means for containing water using the piezoelectric element comprise a piezoelectric strip.

15. The irrigation apparatus of claim 11, further comprising: a means for storing energy,
    wherein the piezoelectric element is further configured to recharge the means for storing energy.

16. The irrigation apparatus of claim 11, wherein the piezoelectric element is further configured provide power to the means for increasing the throttling of the supplied water and the means for decreasing the throttling of the supplied water.

* * * * *